United States Patent
Vigier-Blanc et al.

(10) Patent No.: US 8,654,446 B2
(45) Date of Patent: Feb. 18, 2014

(54) OPTICAL IMAGING ELEMENT AND MODULE FOR AN OPTICAL SEMICONDUCTOR COMPONENT, METHOD FOR PROCESSING AN OPTICAL IMAGING ELEMENT AND IMAGE CAPTURE APPARATUS

(75) Inventors: Emmanuelle Vigier-Blanc, Le Sappey en Chartreuse (FR); Guillaume Cassar, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 563 days.

(21) Appl. No.: 12/937,971

(22) PCT Filed: Apr. 8, 2009

(86) PCT No.: PCT/EP2009/054211
§ 371 (c)(1),
(2), (4) Date: Feb. 24, 2011

(87) PCT Pub. No.: WO2009/127571
PCT Pub. Date: Oct. 22, 2009

(65) Prior Publication Data
US 2011/0134304 A1    Jun. 9, 2011

(30) Foreign Application Priority Data

Apr. 18, 2008 (FR) .................................... 08 52650

(51) Int. Cl.
*G02B 3/00* (2006.01)
*G02B 9/00* (2006.01)
*C03C 27/00* (2006.01)
*H01L 21/322* (2006.01)
*C23C 14/00* (2006.01)

(52) U.S. Cl.
USPC ............. 359/653; 359/652; 359/654; 65/394; 117/2; 216/87; 427/523; 427/526; 427/530; 427/531

(58) Field of Classification Search
USPC ........... 359/652–654; 65/394; 117/2; 216/87; 427/523, 526, 530, 531
See application file for complete search history.

(56) References Cited

U.S. PATENT DOCUMENTS 3,823,995 A * 7/1974 Carpenter .................... 385/124
3,859,103 A * 1/1975 Yoshiyagawa et al. ....... 385/124

(Continued)

FOREIGN PATENT DOCUMENTS

EP    1424570 A1    6/2004
EP    1785750 A1    5/2007

(Continued)

OTHER PUBLICATIONS

English Abstract for JP2002-148411.

(Continued)

*Primary Examiner* — Evelyn A. Lester
(74) *Attorney, Agent, or Firm* — Gardere Wynne Sewell LLP (57) ABSTRACT

An optical element or module is designed to be placed in front of an optical sensor of a semiconductor component. At least one optically useful part of the element or module is provided through which the image to be captured is designed to pass. A method for obtaining such an optical element or module includes forming at least one through passage between a front and rear faces of the element or module. The front and rear faces are covered with a mask. Ion doping is introduced through the passage. As a result, the element or module has a refractive index that varies starting from a wall of the through passage and into the optically useful part. An image capture apparatus includes an optical imaging module having at least one such element or module.

24 Claims, 8 Drawing Sheets

(56) References Cited

U.S. PATENT DOCUMENTS

| | | | |
|---|---|---|---|
| 4,268,112 A * | 5/1981 | Peterson | 385/61 |
| 4,639,094 A | 1/1987 | Aono | |
| 4,761,062 A * | 8/1988 | Loce et al. | 359/654 |
| 4,805,997 A | 2/1989 | Asahara et al. | |
| 5,062,688 A | 11/1991 | Okuda et al. | |
| 5,136,428 A | 8/1992 | Ray | |
| 5,171,344 A * | 12/1992 | Noda | 65/395 |
| 5,448,409 A * | 9/1995 | Noda | 359/654 |
| 5,808,806 A | 9/1998 | Guhman et al. | |
| 5,870,638 A | 2/1999 | Kurosawa | |
| 6,232,590 B1 | 5/2001 | Baek | |
| 7,173,767 B2 * | 2/2007 | Satzke | 359/652 |
| 7,876,504 B2 | 1/2011 | Vigier-Blanc et al. | |
| 8,354,293 B2 * | 1/2013 | Vigier-Blanc et al. | 438/65 |
| 2002/0044739 A1 | 4/2002 | Vahala et al. | |
| 2004/0032523 A1 | 2/2004 | Hartlove et al. | |
| 2006/0033176 A1 | 2/2006 | Mun | |
| 2006/0082895 A1 | 4/2006 | Inoue et al. | |
| 2006/0254316 A1 | 11/2006 | Leu | |
| 2007/0035721 A1 | 2/2007 | Toshikiyo et al. | |
| 2007/0069108 A1 | 3/2007 | Inaba | |
| 2007/0145242 A1 | 6/2007 | Toyoda et al. | |
| 2009/0190231 A1 | 7/2009 | Lenchenkov | |

FOREIGN PATENT DOCUMENTS

| | | |
|---|---|---|
| EP | 1944808 A1 | 7/2008 |
| JP | 2002-148411 A | 5/2002 |
| WO | WO-2005/076361 A1 | 8/2005 |

OTHER PUBLICATIONS

Republique Francais Search Report, dated Nov. 21, 2008, for FR 0852650 (2 pages).

International Search Report, mailed Jun. 29, 2009 for PCT/EP2009/054211 (3 pages).

* cited by examiner

OPTICAL IMAGING ELEMENT AND MODULE FOR AN OPTICAL SEMICONDUCTOR COMPONENT, METHOD FOR PROCESSING AN OPTICAL IMAGING ELEMENT AND IMAGE CAPTURE APPARATUS

PRIORITY CLAIM

This application is a 371 filing from PCT/EP2009/054211 filed Apr. 8, 2009, which claims the benefit of French Application for Patent No. 0852650 filed Apr. 18, 2008, the disclosures of which are hereby incorporated by reference.

TECHNICAL FIELD

The present invention relates to the general field of cameras and, more particularly, the field of optical imaging modules for projecting images onto optical image sensors of semiconductor components.

SUMMARY

According to one aspect, an optical element designed to be placed in front of an optical sensor of a semiconductor component, through at least one optically useful part of which the light beam of the images to be captured is designed to pass, can comprise at least one through passage running between its front and rear faces and having a refractive index that varies starting from the wall of the at least one through passage and into the optically useful part.

According to one variant, the at least one through passage can be formed outside of the optically useful part, the refractive index varying as far as the inside of this optically useful part.

According to another variant, the at least one through passage can be formed inside the optically useful part, this passage being filled with a material forming a plug whose periphery, at least, has a refractive index equal or close to the refractive index of the part immediately adjacent to this passage.

According to another variant, the optical element can comprise several through passages and have a refractive index that varies starting from the walls of these through passages.

According to one variant of the invention, the optical element can comprise two parallel faces forming a pastille (e.g., pellet, disk or block).

According to another variant, the optical element can comprise at least one protruding part forming an optical lens.

According to one aspect, a method for processing a wafer, at least certain parts of which are to be used for the fabrication of optical imaging elements designed to be placed in front of semiconductor component optical image sensors and comprising optically useful parts through which the light beam of the images to be captured is designed to pass, can comprise the following steps: form through passages between the front face and the rear face of the wafer; form masks not covering the passages on the front face and the rear face of the wafer; dope the material of the wafer with ions starting from the walls of the through passages and into the optically useful parts in such a manner as to modify the refractive index in a part of these optically useful parts; and remove the masks.

According to one variant, the through passages can be formed outside of the optically useful parts of the optical elements.

According to another variant, the through passages can be formed inside the optically useful parts of the optical elements, and the through passages are later filled with a material forming plugs, having the optical properties of the walls of these through passages.

According to one variant, the wafer can have parallel faces.

According to another variant, the wafer can have protruding parts forming optical lenses.

According to another aspect, an optical imaging module can comprise at least one optical element such as previously defined.

This module can comprise a semiconductor component having an image sensor placed opposite the optical element.

According to another aspect, an image capture apparatus can comprise an optical imaging module placed in front of an optical sensor of a semiconductor component, where this optical imaging module can comprise at least one optical element such as previously defined.

BRIEF DESCRIPTION OF THE DRAWINGS

Optical elements and optical modules designed to be placed in front of or before an optical sensor of a semiconductor component, capable of being installed in an apparatus, together with their processing modes, are now described by way of non-limiting examples and illustrated by the drawing in which.

DETAILED DESCRIPTION OF THE DRAWINGS

Figure 1:
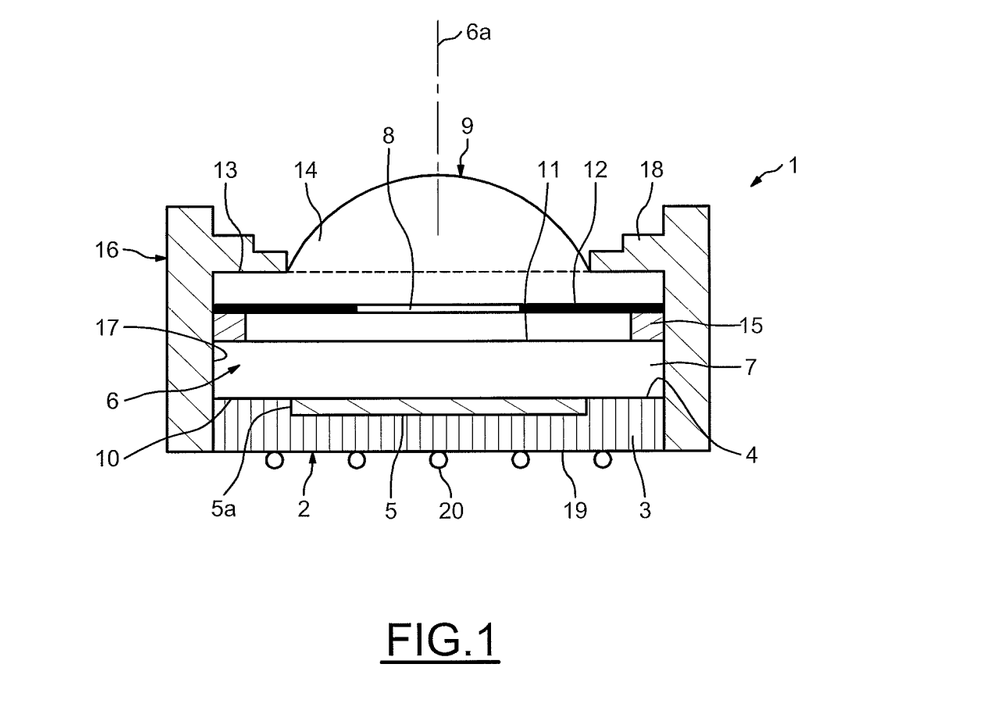
FIG. 1 shows an axial cross section of an image capture apparatus including an optical module.

Referring to FIG. 1, an image capture apparatus is shown which can comprise an optical unit 1 which can comprise a stack 2 comprising a semiconductor component 3 having within its front face 4 an optical image sensor 5 and comprising an optical imaging module 6 placed in front of or before the front face 4 of the optical image sensor 5.

According to the present description, an optical image sensor 5 is capable of capturing images of a scene happening in front of the unit 1. Such an image sensor 5 generally occupies a rectangular central area 5a and generally comprises a multiplicity of elementary photodiodes respectively transforming a flux of photons into an electrical signal, forming pixels.

According to the present description, an optical imaging module 6 is an optical device through which an optical image sensor 5 sees the scene.

According to the example shown, the optical imaging module 6 comprises, from the rear towards the front and along the same optical axis 6a passing through the center of the optical sensor 5, an optical element formed by a transparent pastille 7 (e.g., pellet, disk or block) preferably made of glass, an iris 8 and an optical element formed by a front optical lens 9 preferably made of glass.

The rear face 10 and the front face 11 of the transparent pastille 7 are parallel.

The rear face 12 and the periphery of the front face 13 of the optical lens 12 are parallel and the front face has a domed central part 14 so as to form a lens converging towards the rear.

The iris 8 is formed on the rear face 12 of the optical lens 9, for example by deposition.

The optical lens 12 with the iris 8 is set with a gap from the front face 11 of the transparent pastille 7 thanks to support legs or a peripheral ring 15 forming a spacer.

The optical unit 1 also comprises an opaque housing 16 having an axial passage 17 bounded at the front by an internal annular shoulder 18. The stack 2 is axially lodged into the axial passage 17 of the opaque housing 15, the domed part 14 of the optical lens 9 passing through the internal shoulder 18 and the peripheral part of the front face 13 of the lens 11 surrounding the domed part 14 sitting against the internal shoulder 18. The perimeter of the stack 2 can be square and snugly fitted into an axial passage 17 with square section.

The rear face 19 of the semiconductor component 3, which is situated on the rear face of the housing 16, is equipped with beads (e.g., solder balls) 20 for external electrical connection of the optical sensor 5.

The optical unit 1 hereinabove can be assembled by bonding.

The transparent pastille 7 and/or the optical lens 9 are adapted such that, within their optically useful parts, in other words the parts through which the image to be captured passes, the refractive index varies over at least one substantially annular part and/or over a central part.

In one example, the refractive index of the transparent pastille 7 can increase substantially from the optical axis 6a or beyond a central part going out to its periphery and/or the refractive index of the optical lens 9 can decrease beyond a central part going out to its periphery.

In order to obtain the transparent pastille 7 and the optical lens 9 exhibiting such variable refractive indices, adapted doping of the glass is carried out with metal ions selected from amongst ions of, for example, sodium ($Na^+$), potassium ($K^+$), lithium ($Li^+$), silver ($Ag^+$), caesium ($Cs^+$) or thallium ($Tl^+$).

As an example, the manner in which a multiplicity of transparent pastilles 7 with variable refractive index or with a refractive index gradient can be fabricated will now be described.

Figure 2:
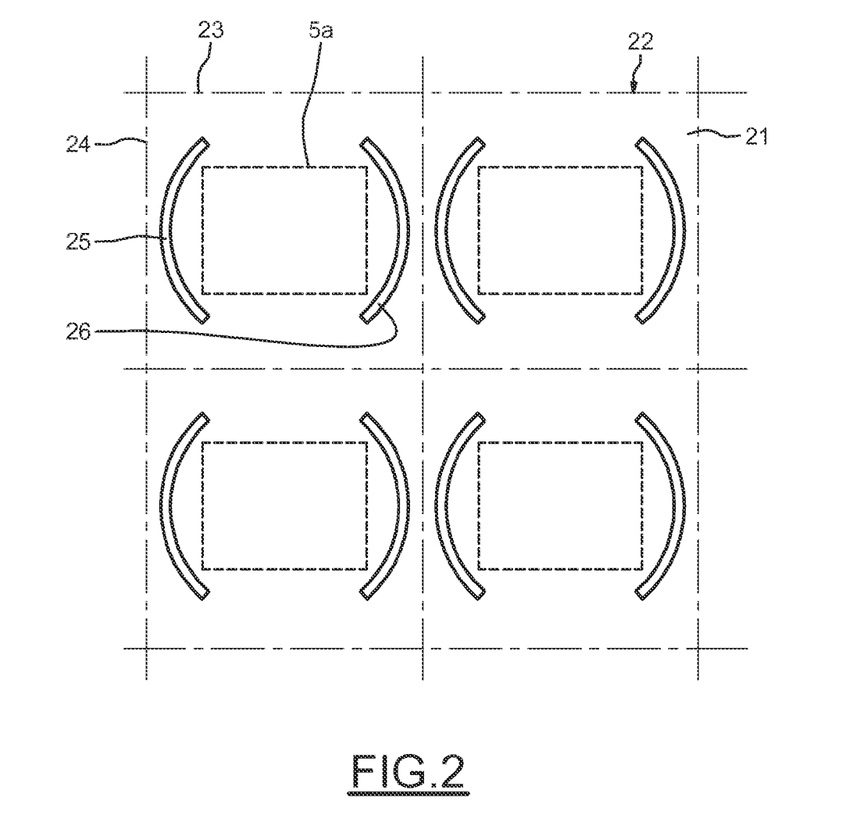
FIG. 2 shows a top view of a first wafer comprising first optical elements.
Figure 3:
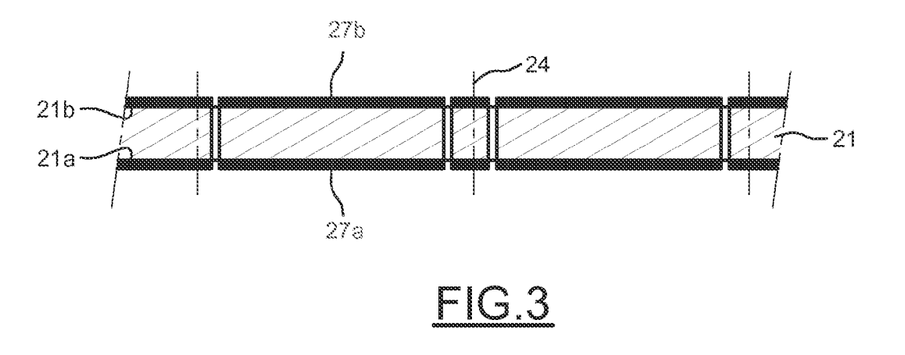
FIG. 3 shows a cross section of the wafer according to FIG. 2.

As shown in FIGS. 2 and 3, a large transparent circular wafer 21 can be used, for example made of glass, having parallel opposing faces 21a and 21b. This wafer is for example subjected to a prior doping, substantially uniformly within its bulk, for example with thallium ions ($Tl^+$), for example by dipping it into a thallium nitrate ($TlNO_3$) bath under the effect of an accelerator electric field oriented in the direction of its thickness.

The circular wafer 20 is divided, in an imaginary manner, into adjacent square areas 22 bounded by perpendicular lines 23 and 24, these adjacent squares 22 corresponding to transparent pastilles 7 to be fabricated.

The rectangular area 5a of an optical image sensor 5, which substantially determines an optically useful part of each square area 22, in other words that through which the light beam of the images to be captured passes, can be placed in an imaginary manner, concentrically, onto each square area 22.

According to one example relating to this configuration, the following processing operation may be carried out.

Two opposing oblong through holes or passages 25 and 26 are formed through the wafer 21, on each square area 22, that take the form of arcs of the same circle, centered on the center of each area 5a, between the faces 21a and 21b. Such oblong through holes or passages can be formed by means of a laser or any other suitable means.

These opposing oblong through holes or passages 25 and 26 are formed on the outside of each rectangular area 5a and run along the short sides of this rectangular area 5a, and also to a limited extent and symmetrically along its longer sides.

Subsequently, opposing masks 27 and 28 not covering the through holes or passages 25 and 26 are formed on the opposing faces 21a and 21b of the wafer 21 in the form of layers for example by deposition.

Following this, doping of the material of the wafer 21, for example with sodium ions ($Na^+$), through masks 27 and 28 and starting from the walls of the through holes or passages 25 and 26 is carried out for example by dipping it into a sodium nitrate ($NaNO_3$) bath, which can flow into the through holes or passages 25 and 26 between their two ends, and which could be enhanced by the effect of an accelerator electric field. The width of the oblong through holes or passages 25 and 26 is adapted in order to facilitate the convection or the flow of the bath so that the ion doping or implantation takes place preferably in a regular manner over the thickness of the wafer 21.

The doping hereinabove is designed to propagate in the direction of the thickness of the wafer 21 starting from the walls of the through holes or passages 25 and 26 and radially with respect to the latter, as far as the inside of each optically useful part corresponding to each rectangular area 5a, in such a manner that the density of $Na^+$ ions contained in the material substantially decreases in the direction of the orthogonal axis of each rectangular area 5a, while however leaving a substantially cylindrical central part exempt from such processing.

Figure 4:
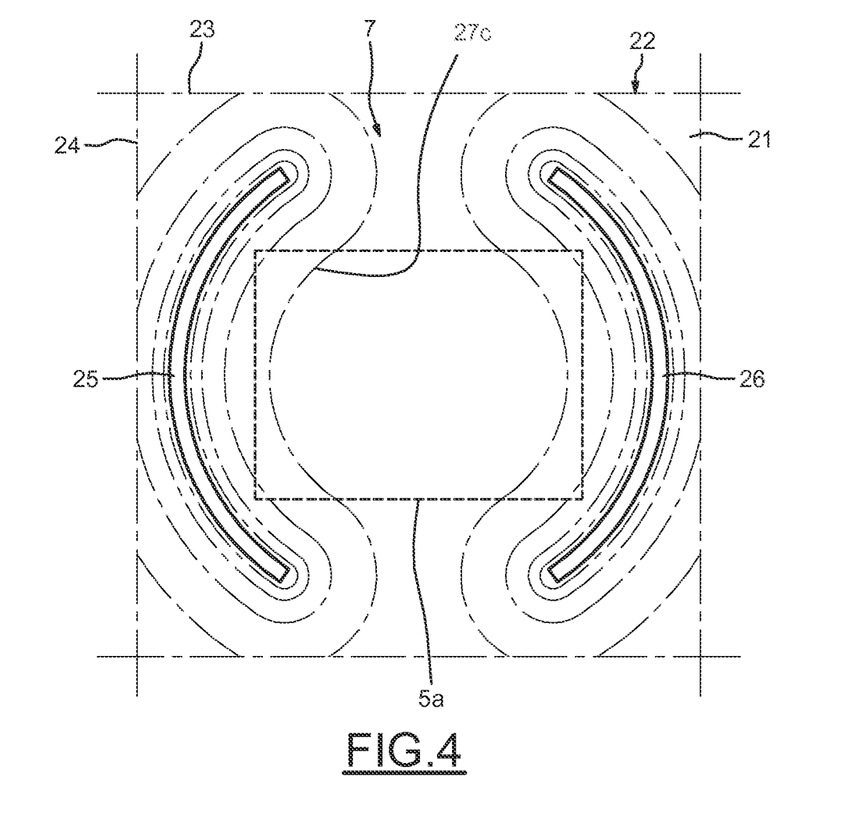
FIG. 4 shows a magnified top view of the wafer in FIG. 2.
Figure 5:
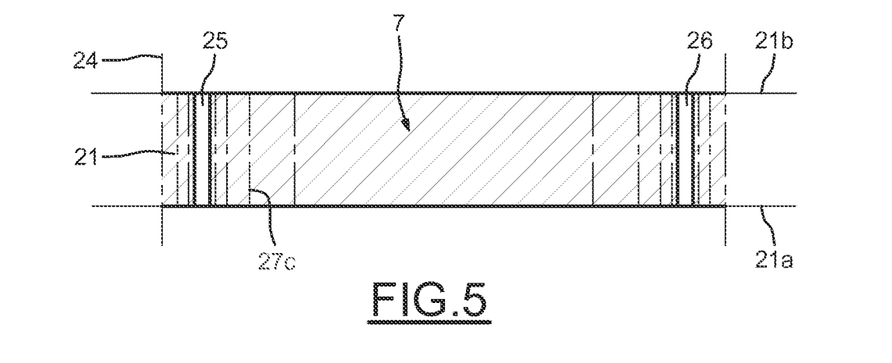
FIG. 5 shows a magnified cross section of the wafer in FIG. 3.

Such a doping process is shown schematically in FIGS. 4 and 5 in the form of contours of concentration level 27.

In view of the preceding dispositions, according to one variant, the doping process is essentially carried out in the corners of the optically useful parts corresponding to the rectangular areas 5a, according to contours of concentration level 27 taking the form of circular arcs centered approximately on the centers of these rectangular areas 5a.

Subsequently, as is also shown in FIGS. 4 and 5, the masks 23 and 24 are removed.

Figure 6:
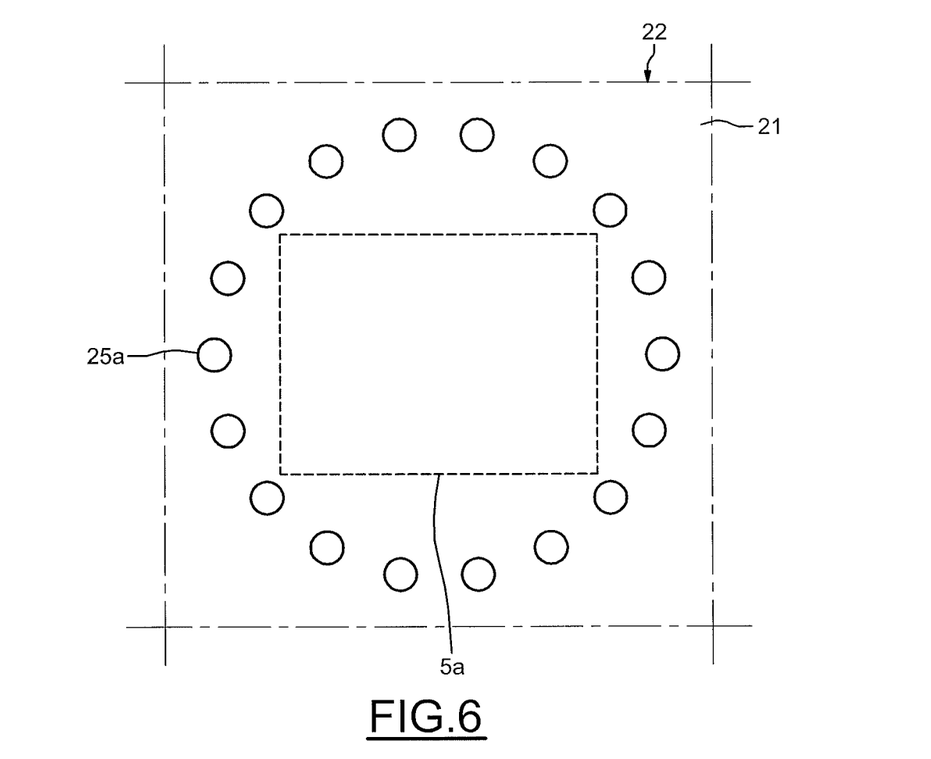
FIG. 6 shows a top view of a variant embodiment of the wafer in FIG. 4.

According to one variant shown in FIG. 6, the oblong through holes or passages 25 and 26 could be replaced by multiplicities of through holes or passages 25a, for example cylindrical, placed judiciously, for example disposed along a circle centered on the area 5a and potentially spaced out at equal distances, possibly over the whole circle but not necessarily so. The diameter of the through holes 25a can be relatively large with a view to an improved flow in the processing bath.

As an example, the manner in which a multiplicity of optical lenses 9 with a variable refractive index or refractive index gradient can be fabricated will now be described.

Figure 7:
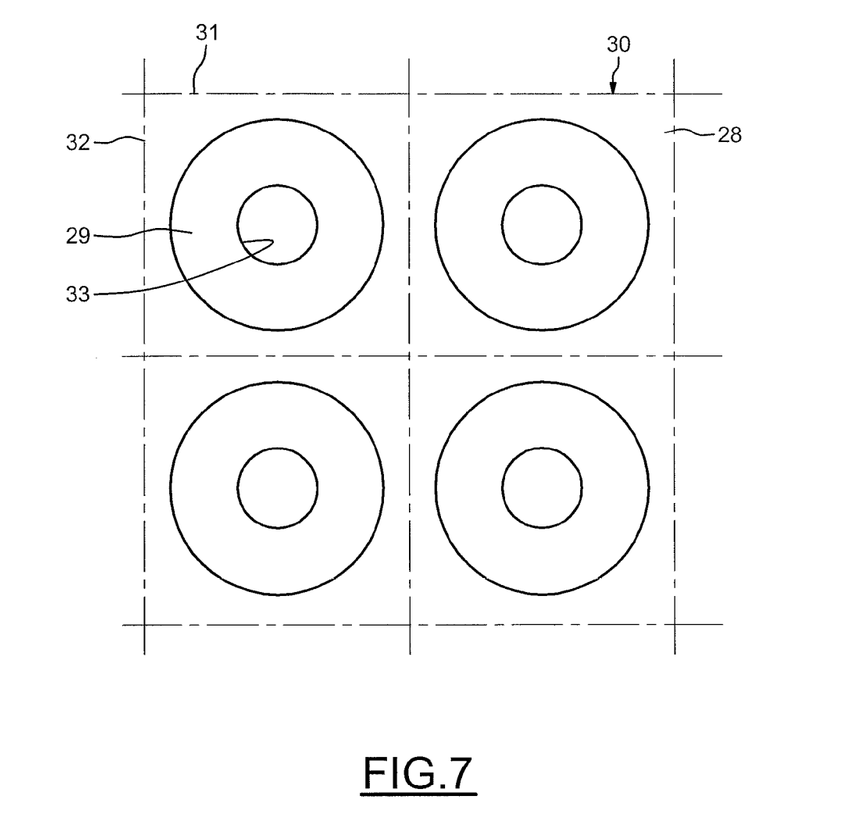
FIG. 7 shows a top view of a second wafer comprising second optical elements.
Figure 8:
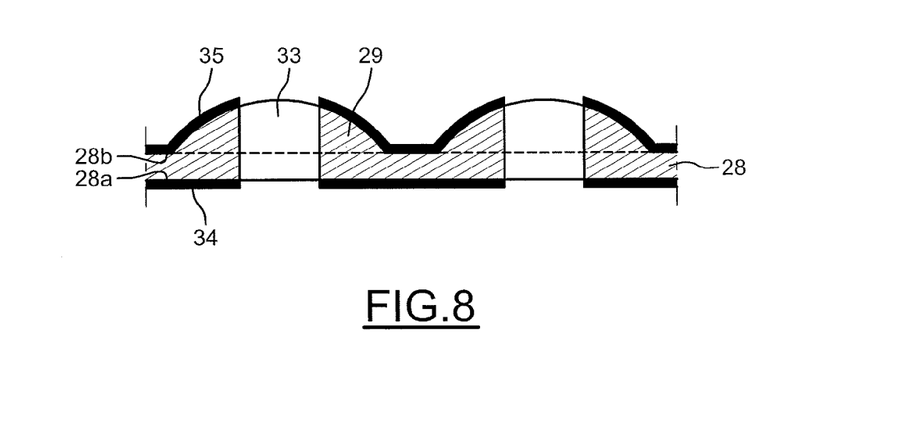
FIG. 8 shows a cross section of the wafer according to FIG. 7.

As shown in FIGS. 7 and 8, a large circular transparent wafer 28 can be used, for example made of glass, having a flat rear face 28a and a generally flat front face 28b and having a multiplicity of domed protruding parts 29 arranged in a square matrix and formed in the middle of adjacent square areas 30 bounded by imaginary perpendicular lines 31 and 32, these adjacent square areas 30 corresponding to optical lenses 9 to be obtained.

A prior doping of the wafer 28, within its bulk, is carried out, for example with thallium ions (Tl⁻), for example by dipping it into a thallium nitrate (TlNO₃) bath.

Taking such a wafer 28, circular holes or passages 33 through the wafer 28 are formed from one face to the other, respectively concentrically to the domed protruding parts 29. Such through holes or passages 33 can be formed by means of a laser or any other suitable means.

Subsequently, opposing masks 34 and 35 not covering the through holes or passages 33 are formed on the opposing faces 28a and 28b and on the domed parts 29 of the wafer 28, in the form of layers for example by deposition.

Following this, doping of the wafer 28, for example with sodium ions (Na⁺), is carried out, for example by dipping it into a sodium nitrate (NaNO₃) bath which penetrates into the holes or passages 33 via their two ends.

The doping hereinabove is designed to propagate in the direction of the thickness of the wafer 28 starting from the walls of the through holes or passages 33 and radially with respect to the latter, in such a manner that the density of Na⁺ ions contained in the material decreases starting from the walls of the through holes or passages 33 and radially in the direction of the thickness of the wafer 28.

This results in a decrease of the refractive index of each lens 9, according to a radial gradient determined by the radial variation of the density of the doping ions in the glass, starting from the walls of the through holes or passages 33 and in the direction of the thickness of the wafer 28.

Figure 9:
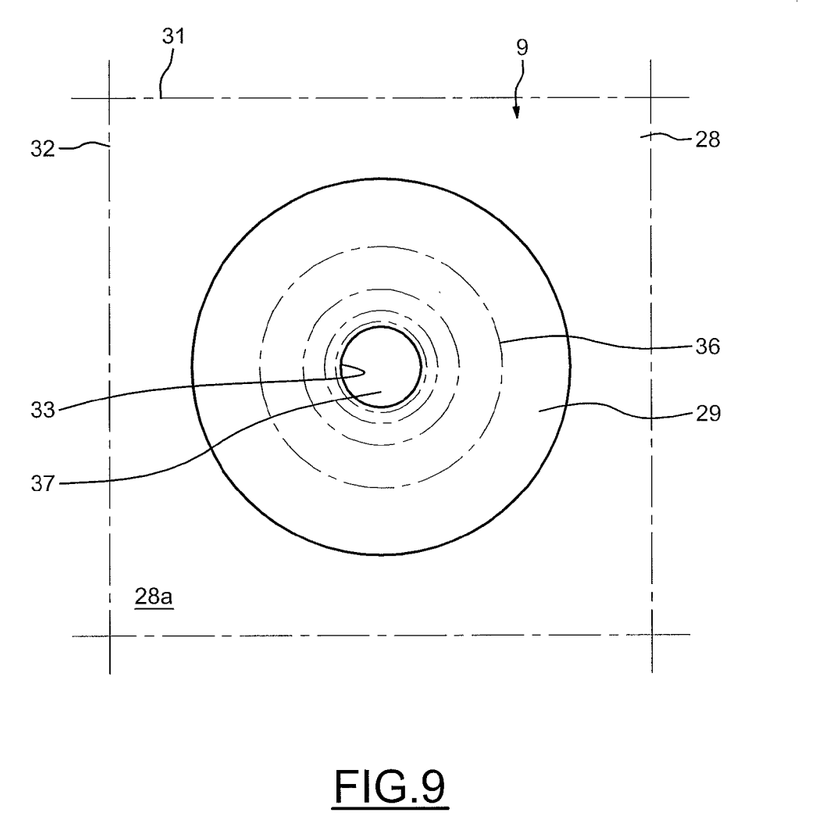
FIG. 9 shows a magnified top view of the wafer in FIG. 7.
Figure 10:
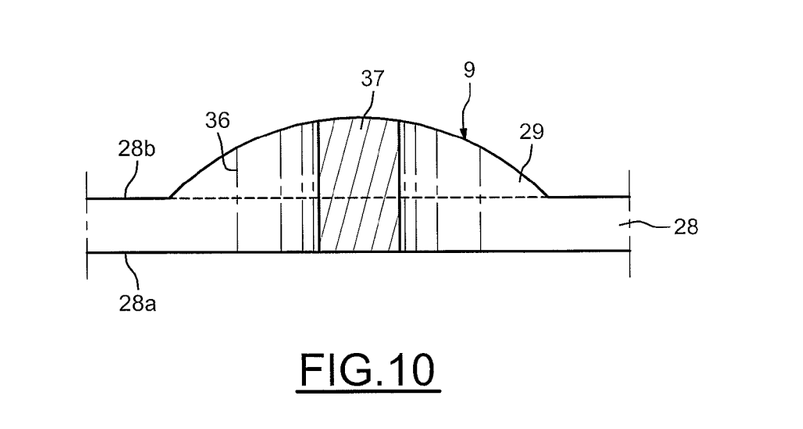
FIG. 10 shows a magnified cross section of the wafer in FIG. 8.

Such a doping process is shown schematically in FIGS. 9 and 10 in the form of contours of concentration level 36 that take the form of circles centered approximately on the centers of the square areas 30.

The masks 34 and 35 are subsequently removed.

Then, as shown in FIGS. 9 and 10, the through holes or passages 33 are filled with a material so as to form plugs 37 whose refractive index is equal or as close as possible to the refractive index of the material of the parts of the wafer 28 immediately adjacent to the through holes or passages 33.

A multiplicity of lenses 9 having a central part with a constant refractive index, surrounded by a part with refractive index decreasing radially towards the outside, is then obtained in the wafer 28.

Taking a wafer 28 thus processed, a multiplicity of irises 8, corresponding to the optical lenses 9, are formed on its rear face 28a, for example by deposition.

The manner in which, for example, optical imaging modules 6 and stacks 2 can be fabricated will now be described.

The processed wafer 21 can be taken and each individual pastille 7 released by cutting along the lines 23 and 24 and the processed wafer 28 can be taken and each individual lens 9 released by cutting along the lines 31 and 32. Then, the pastilles 7 and the lenses 9 can be individually stacked and bonded on top of one another in order to obtain individual optical modules 6. The optical modules 6 can then be individually stacked and bonded onto individual semiconductor components 3 in order to obtain individual stacks 2, or semiconductor components 3 of a semiconductor wafer 3 which will then be diced up in order to obtain stacks 2.

The processed wafer 21 and the processed wafer 28 can also be taken, placed and bonded on top of one another with the lines 23 and 24 aligned with the lines 31 and 32 so that the pastilles 7 and the lenses 9 are on top of one another in such a manner as to obtain a multiplicity of optical imaging modules 6 on a double wafer.

These optical imaging modules 6 can subsequently be individually released by dicing of the double wafer, then be individually bonded onto individual semiconductor components 3 so as to obtain individual stacks 2, or onto semiconductor components 3 of a wafer comprising semiconductors 3, this wafer then being diced up in order to obtain stacks 2.

The double wafer can also be bonded onto a wafer of semiconductors 3, aligning the optical imaging modules 6 with the semiconductor components 3, then diced up in order to obtain individual stacks 2.

The stacks 2 obtained can then be installed and bonded into housing units 16 as previously described.

Figure 11:
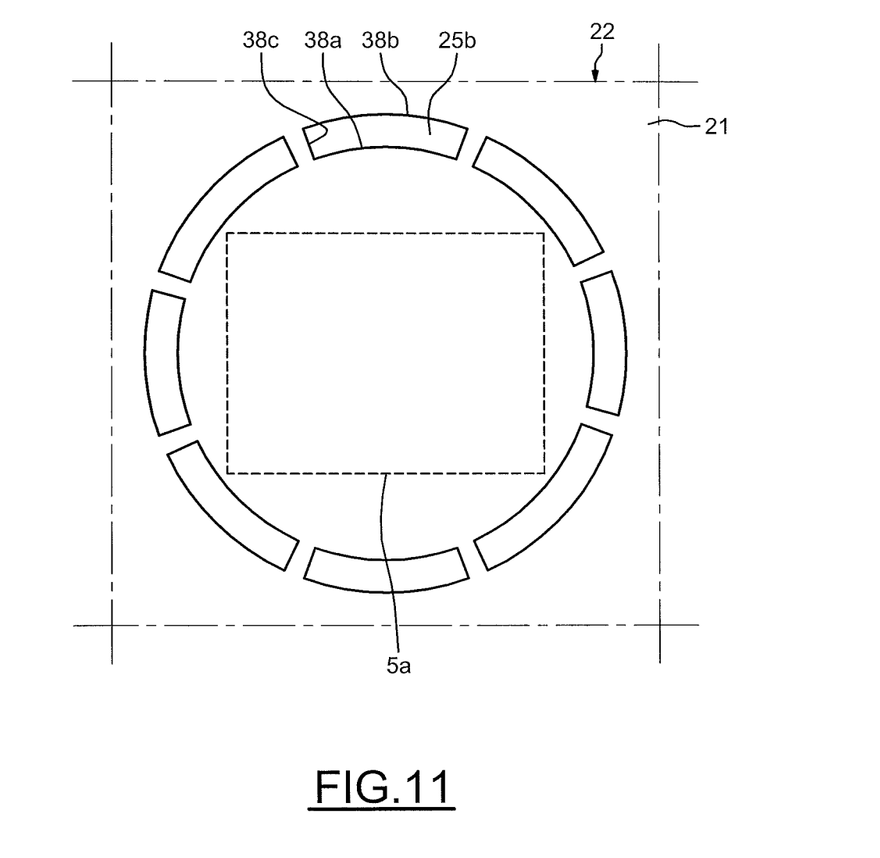
FIG. 11 shows a variant of FIG. 6.

With reference to FIG. 11, it can be seen that one variant embodiment of FIG. 6 is shown, according to which the cylindrical through holes and passages 25a are replaced by a multiplicity of magnified through holes or passages 25b which have a cylindrical internal face 38a, a cylindrical external face 38b and opposing radial faces 38c placed in planes passing through the axis of the area 5a and which may be circumferentially close together, potentially spaced out at equal distances, for example in lots of eight, possibly over a complete circle, but not necessarily. The cylindrical internal face 38a and the cylindrical external face 38b can be separated by a relatively large gap with a view to an improved flow in the processing bath.

The shapes and dispositions of the through holes or passages previously indicated are not limiting. Indeed, through holes or passages with different shapes and dispositions may be provided.

In particular, through holes or passages may be provided within the optically useful areas of the transparent pastilles for doping as previously described, which could be filled with a material as described with reference to FIGS. 9 and 10.

Through holes or passages may also be provided within the areas external to the domed parts 29 of the optical lenses for doping as previously described.

Holes or passages running through the transparent pastilles and/or the optical lenses within the optically useful areas and through holes or passages external to their optically useful areas may also be provided.

Optical modules comprising at least one transparent pastille processed according to at least one of the variants previously described, associated or otherwise with at least one optical lens, may also be formed.

Optical modules comprising at least one optical lens processed according to at least one of the variants previously described, associated or otherwise with at least one transparent pastille, may also be formed.

Figure 12:
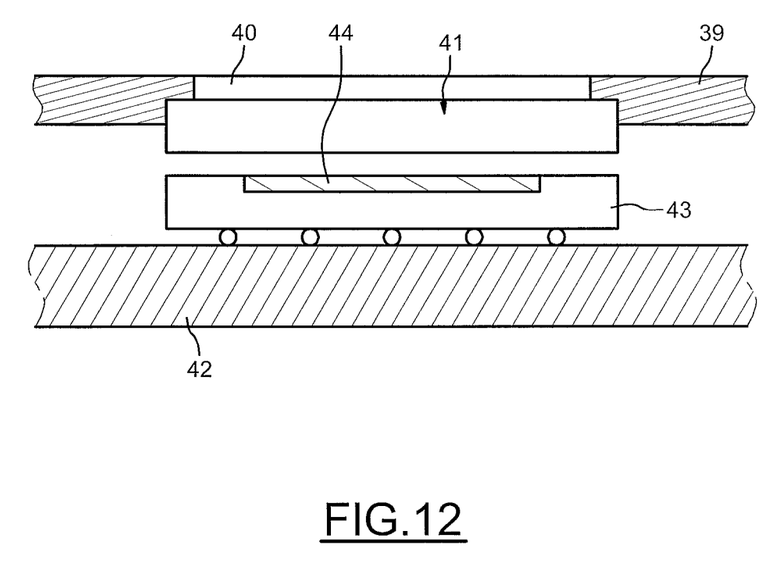
FIG. 12 shows another image capture apparatus.

As can be seen in FIG. 12, an image capture apparatus may also be formed that can comprise a wall 39 having a through orifice 40. This wall can be used as a support for an optical module 41 placed on one side or on the other of this orifice. This optical module 41 can comprise at least one transparent pastille and/or at least one optical lens, processed as previously described. This image capture apparatus can comprise a printed circuit board 42 onto which a semiconductor component 43, comprising an optical sensor 44 placed opposite the optical module 41, is mounted. It goes without saying that this component may also comprise an optical module just before its optical sensor, this optical module being able to be processed or not as described previously. The printed circuit board 42 may of course carry components, not shown, for controlling the optical semiconductor component 43 and for processing the images generated by this optical semiconductor component 43.

The various variants described can contribute to improving the resolving power and/or the contrast of the optical imaging modules associated with optical semiconductor components and can contribute to the ability to enhance the sharpness and/or the contrast of the images captured by the semiconductor components currently available and/or to increase the number of pixels composing the optical image sensors of the components, without reducing the sharpness and/or the contrast of the captured images.

The invention claimed is:

1. Optical element adapted for placement in front of an optical sensor of a semiconductor component, comprising:
   at least one optically useful part through which an image to be captured passes,
   at least one through passage formed between a front face of the optical element and a rear face of the optical element, and
   wherein the optical element has a refractive index that varies starting from a wall of the at least one through passage and extending towards the optically useful part.

2. Optical element according to claim 1, in which the at least one through passage is formed outside of the optically useful part, the refractive index varying as far as the inside of the optically useful part.

3. Optical element according to claim 1, in which the at least one through passage is formed inside the optically useful part, and further including a material forming a plug filling the through passage, wherein a periphery, at least, of the plug has a refractive index equal or close to a refractive index of the optical element immediately adjacent to the through passage.

4. Optical element according to claim 1, wherein the through passage comprises several through passages and wherein the refractive index varies starting from a wall of each one of the through passages.

5. Optical element according to claim 1, wherein the front face and rear face comprise two parallel faces.

6. Optical element according to claim 1, wherein the front face comprises at least one protruding part forming an optical lens.

7. Method, comprising:
   forming one or more through passages between a front face and a rear face of a wafer;
   forming masks on the front face and the rear face of the wafer, but not covering the through passages;
   doping the wafer with ions introduced via the through passages and starting from walls of the through passages and extending into the wafer in such a manner as to modify a refractive index in a part of the wafer; and
   removing the masks.

8. Method according to claim 7, in which the through passages are formed outside of an optically useful part of the wafer through which an image to be captured passes.

9. Method according to claim 7, in which the through passages are formed inside an optically useful part of the wafer through which an image to be captured passes, and further comprising filling said through passages with a material forming plugs, wherein the plugs have optical properties equal or close to optical properties of the doped wafer at the walls of the through passages.

10. Method according to claim 7, in which the front and rear faces of the wafer are parallel.

11. Method according to claim 7, in which the front of the wafer comprises at least one protruding part forming an optical lens.

12. Optical imaging module comprising: at least one optical element including:
   at least one optically useful part through which an image to be captured passes,
   at least one through passage formed between a front face of the optical element and a rear face of the optical element, and
   wherein the optical element has a refractive index that varies starting from a wall of the at least one through passage and extending towards the optically useful part.

13. Module according to claim 12, comprising a semiconductor component having an image sensor placed in alignment with the optically useful part of the optical element.

14. A method, comprising:
   forming a through passage extending from a front face to a rear face of an optical element;
   applying a mask layer to both the front face and the rear face of the optical element, but not covering a wall of the through passage;
   doping the optical element by introducing ions via the through passage and wall so as to modify a refractive index of the optical element; and
   removing the mask layers.

15. The method of claim 14, wherein the front face and the rear face are flat parallel surfaces.

16. The method of claim 14, wherein the front face is a curved surface and the rear face is a flat surface.

17. The method of claim 16, wherein forming the through passage comprises forming the through passage in the curved surface of the front face.

18. The method of claim 16, wherein the front face further includes a flat portion surrounding the curved surface, and wherein forming the through passage comprises forming the through passage in the flat portion surrounding the curved surface.

19. The method of claim 14, wherein a concentration of the ion dopant is greatest near the wall of the through passage, the concentration gradually decreasing within the optical element as a function of distance from the through passage wall.

20. The method of claim 14, further comprising plugging the through passage with an optical material having a refractive index substantially identical to the refractive index of the optical element at the wall of the through passage.

21. The method of claim 14, wherein forming the through passage comprises forming a cylindrical aperture in the optical element.

22. The method of claim 14, wherein forming the through passage comprises forming a slot aperture in the optical element.

23. The method of claim 22, wherein the slot aperture has a curved shape.

24. The method of claim 14, wherein doping the optical element comprises dipping the optical element in a bath of a doping material which flows into the through passage and introducing ions through the wall of the through passage.

* * * * *